United States Patent
Cobb et al.

(10) Patent No.: US 7,706,420 B2
(45) Date of Patent: Apr. 27, 2010

(54) OPTICAL POWER MODULATION AT HIGH FREQUENCY

(75) Inventors: Joshua Monroe Cobb, Victor, NY (US); Paul G Dewa, Newark, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 11/605,886

(22) Filed: Nov. 29, 2006

(65) Prior Publication Data

US 2008/0055579 A1    Mar. 6, 2008

Related U.S. Application Data

(60) Provisional application No. 60/842,306, filed on Sep. 5, 2006.

(51) Int. Cl.
  *H01S 3/10* (2006.01)
(52) U.S. Cl. .................. 372/25; 359/223.1
(58) Field of Classification Search ............. 372/25
  See application file for complete search history.

(56) References Cited

U.S. PATENT DOCUMENTS

| | | | | |
|---|---|---|---|---|
| 3,133,198 A * | 5/1964 | Kaminow et al. | ........ | 359/245 |
| 3,506,834 A * | 4/1970 | Buchsbaum et al. | ........ | 398/101 |
| 3,604,936 A | 9/1971 | Kompfner | | |
| 3,705,755 A * | 12/1972 | Baer | ........ | 359/202 |
| 4,862,468 A * | 8/1989 | Fink | ........ | 372/19 |
| 4,884,101 A | 11/1989 | Tanimoto | ........ | 355/68 |
| 4,970,546 A | 11/1990 | Suzuki et al. | ........ | 355/53 |
| 5,119,390 A | 6/1992 | Ohmori | ........ | 372/25 |
| 5,162,929 A | 11/1992 | Roddy et al. | | |
| 5,250,797 A | 10/1993 | Sano et al. | ........ | 250/205 |
| 5,408,319 A * | 4/1995 | Halbout et al. | ........ | 356/480 |
| 5,473,412 A | 12/1995 | Ozawa | ........ | 355/77 |
| 5,627,627 A | 5/1997 | Suzuki | ........ | 355/68 |
| 5,956,355 A * | 9/1999 | Swanson et al. | ........ | 372/20 |
| 6,011,612 A | 1/2000 | Go et al. | ........ | 355/69 |
| 6,037,967 A | 3/2000 | Allen et al. | ........ | 347/255 |
| 6,154,270 A | 11/2000 | Ozawa | ........ | 355/53 |
| 6,167,173 A * | 12/2000 | Schoeppe et al. | ........ | 385/33 |
| 6,476,905 B1 | 11/2002 | Li | ........ | 355/71 |
| 6,573,531 B1 * | 6/2003 | Im et al. | ........ | 257/45 |
| 2003/0165341 A1 * | 9/2003 | Bulow | ........ | 398/75 |
| 2005/0007671 A1 | 1/2005 | Onvlee | | |
| 2005/0157275 A1 * | 7/2005 | Colpaert et al. | ........ | 353/97 |
| 2006/0274922 A1 * | 12/2006 | Ragsdale | ........ | 382/128 |

* cited by examiner

*Primary Examiner*—Minsun Harvey
*Assistant Examiner*—Michael Carter
(74) *Attorney, Agent, or Firm*—Timothy M Schaeberle

(57) ABSTRACT

An apparatus for providing a pulsed radiation beam has a radiation source providing a pulsed radiation beam at a constant pulse repetition frequency. A beam deflector in the path of the pulsed radiation beam is actuable to redirect the pulsed radiation beam cyclically towards each of a plurality of beam intensity modulators in turn. A beam recombiner combines modulated light from each of the plurality of beam intensity modulators in order to form the modulated pulsed radiation beam at the constant pulse repetition frequency.

17 Claims, 20 Drawing Sheets

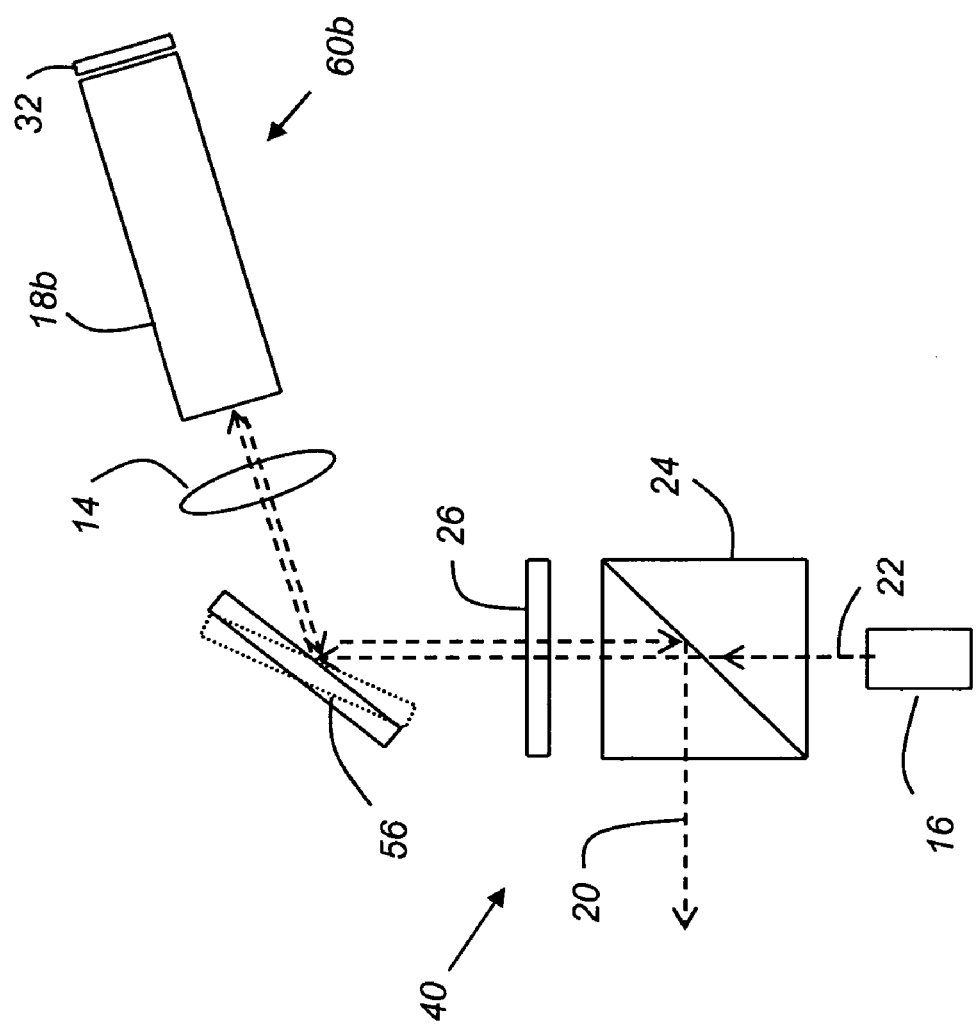

OPTICAL POWER MODULATION AT HIGH FREQUENCY

CROSS-REFERENCE TO RELATED APPLICATIONS

This application claims the benefit of U.S. Provisional Application Ser. No. 60/842,306 filed Sep. 5, 2006 entitled "METHOD AND APPARATUS FOR OPTICAL POWER MODULATION AT HIGH FREQUENCY" by Cobb et al.

FIELD OF THE INVENTION

This invention generally relates to optical power modulation for high-frequency pulsed light sources and more particularly relates to a method and apparatus for obtaining a pulsed light output with variable power, pulse-to-pulse.

BACKGROUND OF THE INVENTION

Pulsed lasers are widely used in applications ranging from surgical devices to lithography systems for forming electronic microcircuits. There are a number of types of devices conventionally used for pulsed laser modulation. These include, for example, devices that deflect a portion of the laser light or cause diffraction, such as various types of acousto-optical modulators (AOM) and electro-optical modulators (EOM). Other types of modulators operate using light polarization state, such as a liquid crystal (LC) modulator. Still other types of pulsed light modulators operate by mechanical action, obstructing some variable portion of the laser beam, actuated by devices such as voice coils, piezoelectric actuators, motors, and servo devices, for example.

Each type of modulator that is conventionally used for pulsed laser modulation has some limitations. For example, mechanical devices operate only within a range of speeds. Some types of devices, such as acousto-optical modulators, are effective only over a range of wavelengths.

One area of particular interest for pulse modulation is in UV lithography. The drive toward continually improved resolution for microcircuit fabrication has stirred interest in using shorter wavelengths, with particular interest in light in the deep UV region, typically less than about 250 nm. However, modulation of a pulsed laser beam in this range presents a number of problems that defy conventional solutions. One problem relates to the spectral range, which exceeds the range of modulator devices such as AOM and EOM devices. For example, typical EOM materials such as KD*P (Potassium Dideuterium Phosphate) or KDP (Potassium Dihydrogen Phosphate) exhibit relatively strong absorption at the UV wavelengths, which results in a lower damage threshold of the material over this spectral range. This eliminates these devices as potential modulators for UV lithography applications.

Another problem relates to high pulse rates. UV light at suitable power levels is efficiently provided by excimer lasers, which can operate at pulse rates of 5-6 KHz or higher. This well exceeds the response speeds of mechanical light modulators that would otherwise be operable in the deep UV range. Thus, the combination of very short wavelengths and relatively high pulse frequencies defies conventional light modulation solutions.

Conventional approaches to pulsed laser modulation, constrained with respect to speed and flexibility, in turn limit the capabilities of UV lithography technology. It is illustrative to consider a few salient examples of conventional approaches:

UK Patent Application GB 2155647A entitled "Controlled Exposure" by Suzuki describes conventional control of pulse energy by controlling the drive signal to the laser itself. This allows variation in pulse-to-pulse intensity, which is desirable for applications such as UV lithography. However, this type of direct modulation of the laser drive current would only be suitable for pulsed lasers only at speeds below a few hundred Hz. Moreover, even if faster response were possible, it is generally more desirable to operate the pulsed laser at a constant power output rather than to attempt continuous modulation of the laser power itself. For these reasons, this type of approach does not provide a workable mechanism for high-speed pulse modulation.

U.S. Pat. No. 4,970,546 entitled "Exposure Control Device" to Suzuki et al. describes the use of a spinning filter wheel that interposes a set of filters in the optical path. Each filter provides a different attenuation level to the light, so that a fixed pattern of attenuation is provided to the laser beam. Such a solution can be used to provide modulation for earlier pulsed laser sources at 500 Hz. However, this solution would not be usable with laser sources more recently developed that operate at 5-6 KHz. Moreover, the attenuation provided with this type of solution yields a discrete fixed set of power levels in a repeated pattern. Other disclosures showing similar spinning filter wheel solutions include those of U.S. Pat. No. 6,476,905 entitled "Step and Scan Exposure System Equipped with a Plurality of Attenuator Blades for Exposure Control" to Li and U.S. Pat. No. 5,119,390 entitled "Energy Amount Controlling Device" to Ohmori.

Thus, although higher pulsed laser frequencies have been achieved in the past few years, lithography systems utilizing UV pulsed lasers have been unable to harness the additional potential this offers for enhanced exposure accuracy and processing speed. There is, then, a need for an apparatus that provides a high-frequency pulsed radiation beam wherein each pulse can be separately modulated.

SUMMARY OF THE INVENTION

It is an object of the present invention to advance the art of laser light modulation. With this object in mind, the present invention provides an apparatus for providing a modulated pulsed radiation beam, comprising:
  a) a radiation source for providing a pulsed radiation beam at a constant pulse repetition frequency;
  b) a plurality of beam intensity modulators;
  c) a beam deflector in the path of the pulsed radiation beam and actuable to redirect the pulsed radiation beam cyclically towards each of the plurality of beam intensity modulators in turn; and
  d) a beam recombiner disposed to combine modulated light from each of the plurality of beam intensity modulators in order to form the modulated pulsed radiation beam at the constant pulse repetition frequency.

It is a feature of the present invention that it provides high frequency modulation by scanning pulsed light to a bank of lower frequency modulators.

It is an advantage of the present invention that it allows high frequency pulsed laser modulation in the deep UV region used for lithography.

These and other objects, features, and advantages of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

FIGS. 5A and 5B are schematic diagrams showing an embodiment using a galvanometric scanner.

DETAILED DESCRIPTION OF THE INVENTION

Figure 1:
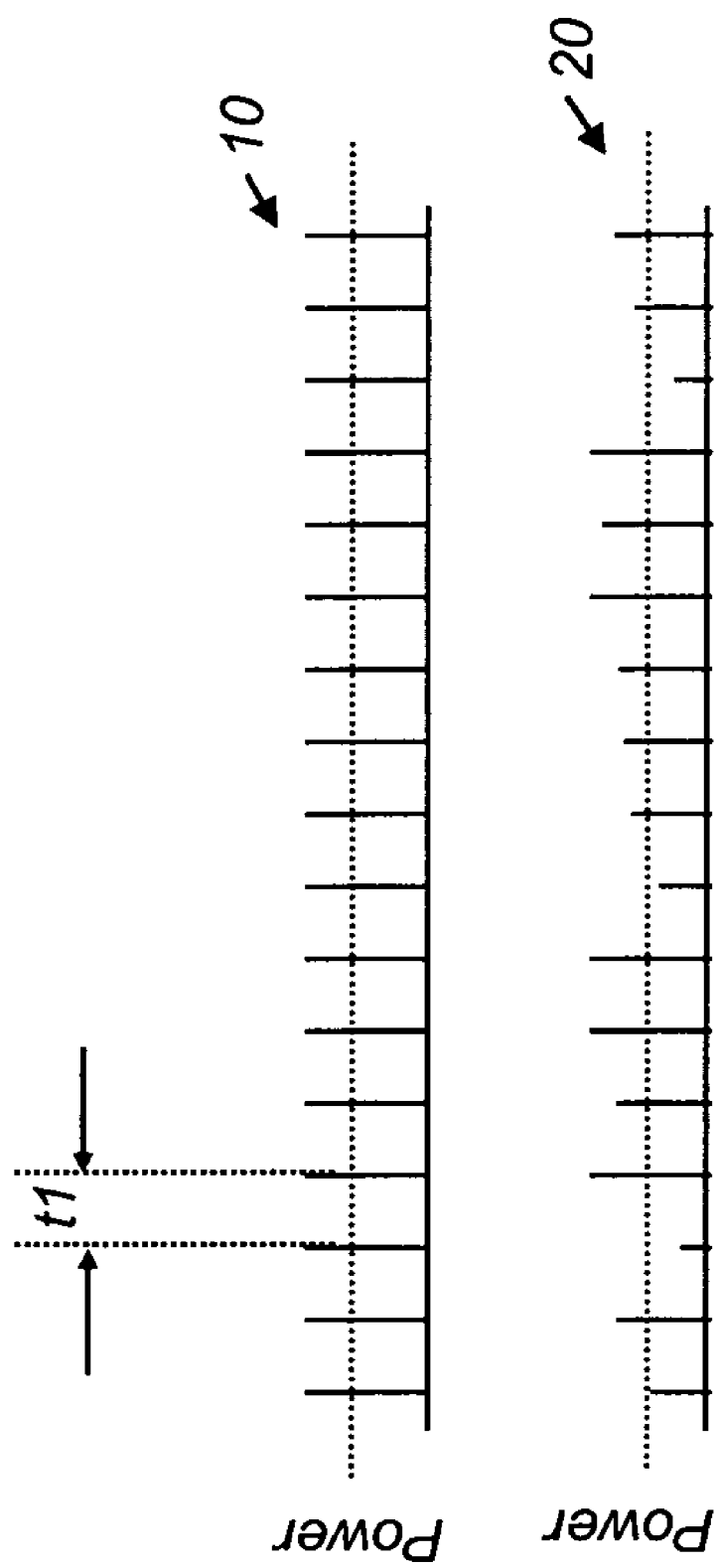
FIG. 1 is a timing diagram showing the input and modulated output pulse sequence using the present invention.

The timing chart of FIG. 1 shows the overall goal of the present invention: namely, to provide a modulated, high frequency pulsed radiation beam 20 that is generated from a pulsed radiation beam 10 having a relatively constant power output. The apparatus and method of the present invention is adaptable to a range of periods t1, particularly including periods t1 that are shorter than the response times of individual modulating components themselves. In embodiments described subsequently, for example, an array of modulator components, where each individual component has a maximum response time of only about 1 KHz, can be used to modulate a pulsed laser beam at a pulsed repetition frequency of 5 KHz (having a period t1 of 0.2 msec). As FIG. 1 shows, each individual pulse of a high-frequency modulated pulsed radiation beam 20 can be modulated, allowing a highly precise delivery of output power, pulse by pulse. Schematic diagrams in subsequent figures show the path of pulsed radiation beam 10 input and show how modulated pulsed radiation beam 20 is formed in various embodiments. In the drawings and text that follow, like components are designated with like reference numerals, and similar descriptions concerning components and arrangement or interaction of components already described are omitted.

Figure 2:
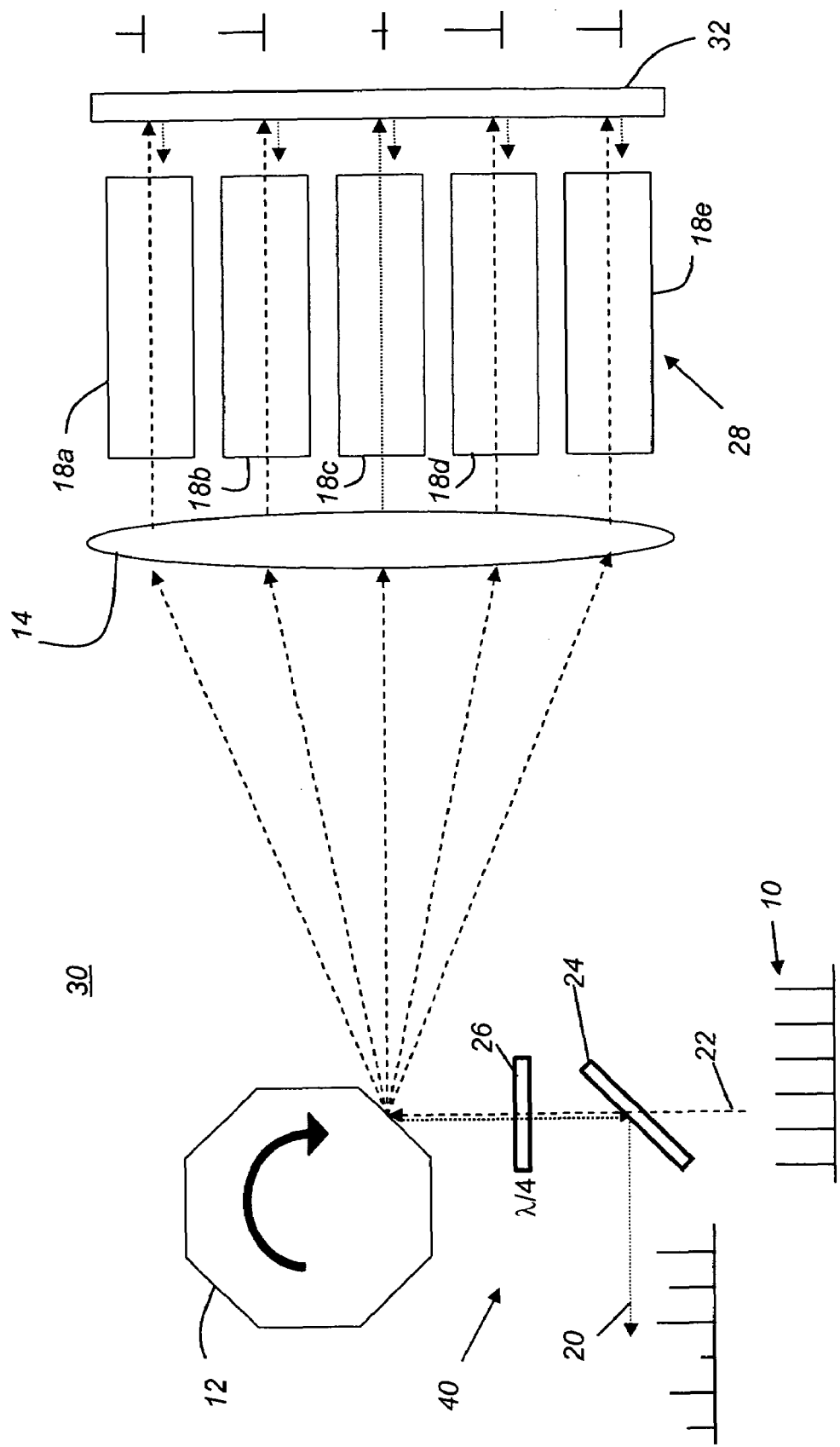
FIG. 2 is a schematic showing one embodiment, with a rotating polygon scanner.
Figure 3A:
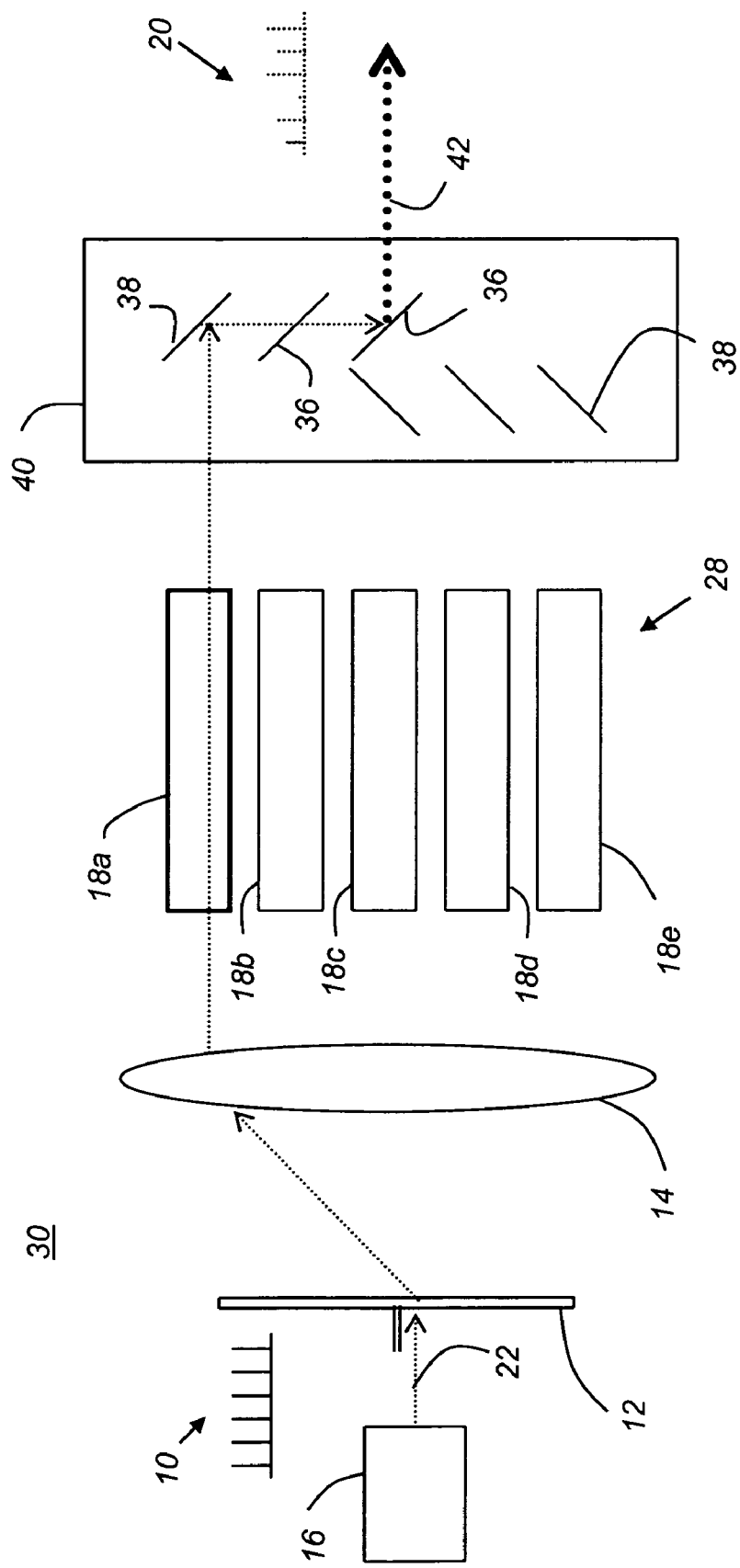
FIGS. 3A through 3E are schematic diagrams showing redirection of each pulse for forming a modulated pulse output.
Figure 3B:
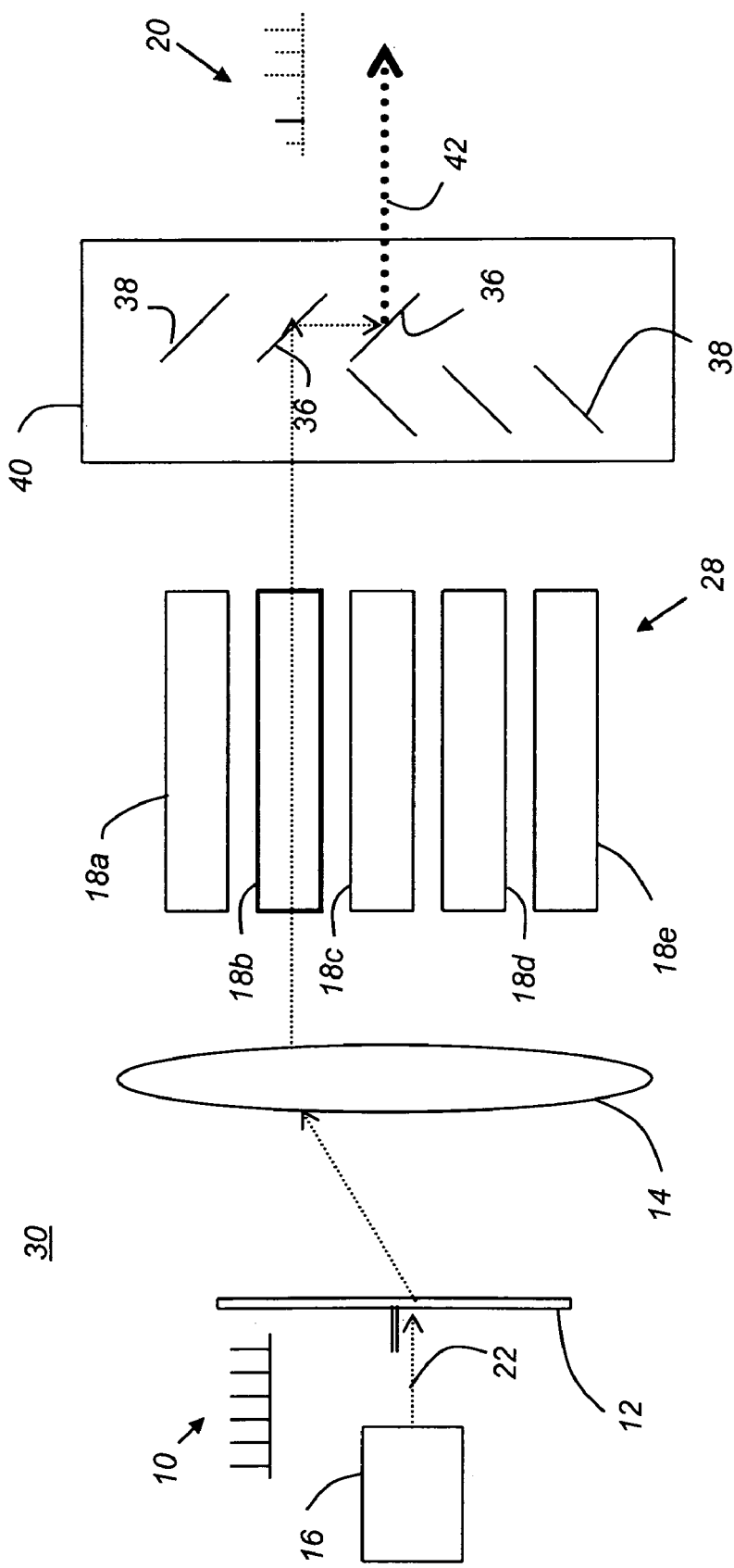
Figure 3C:
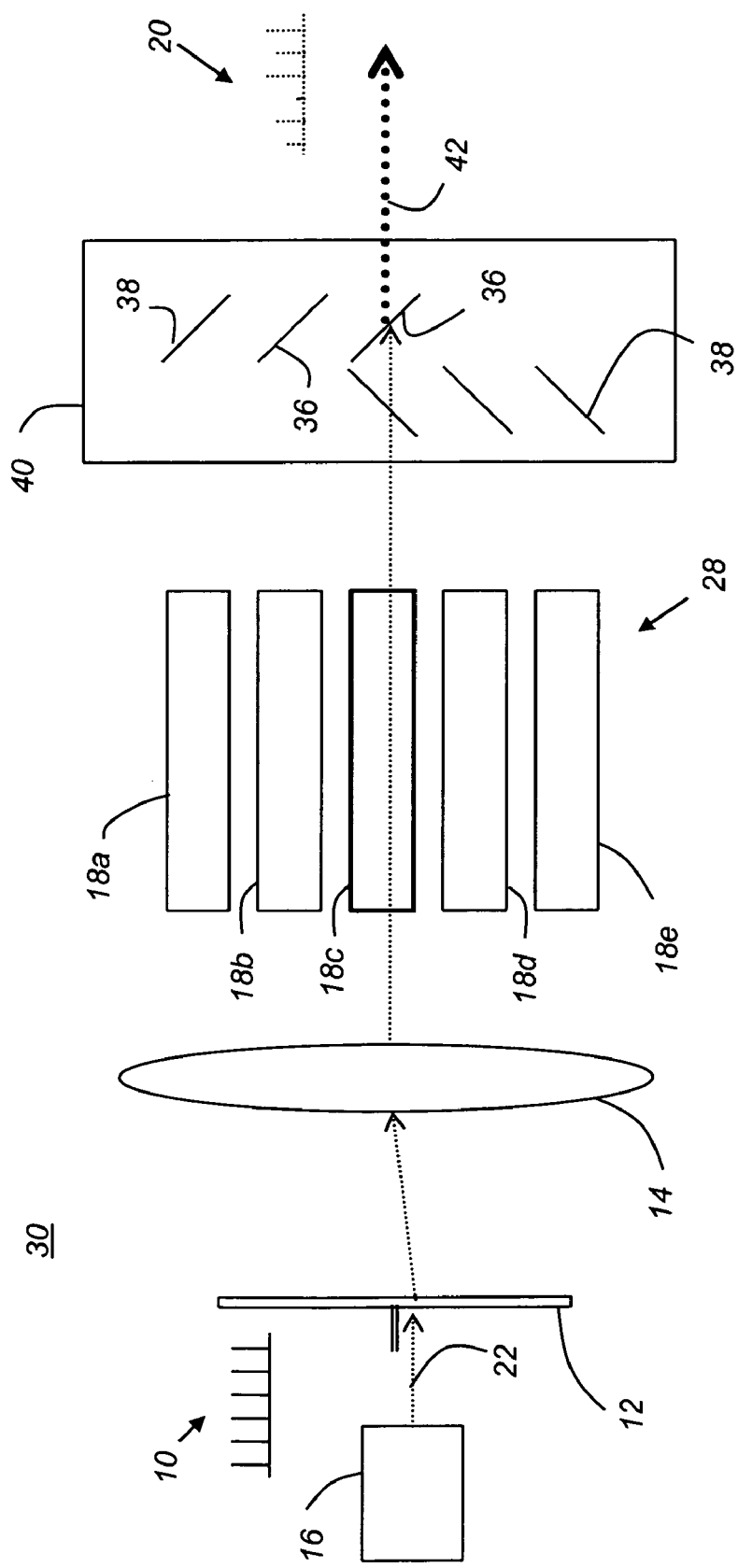
Figure 3D:
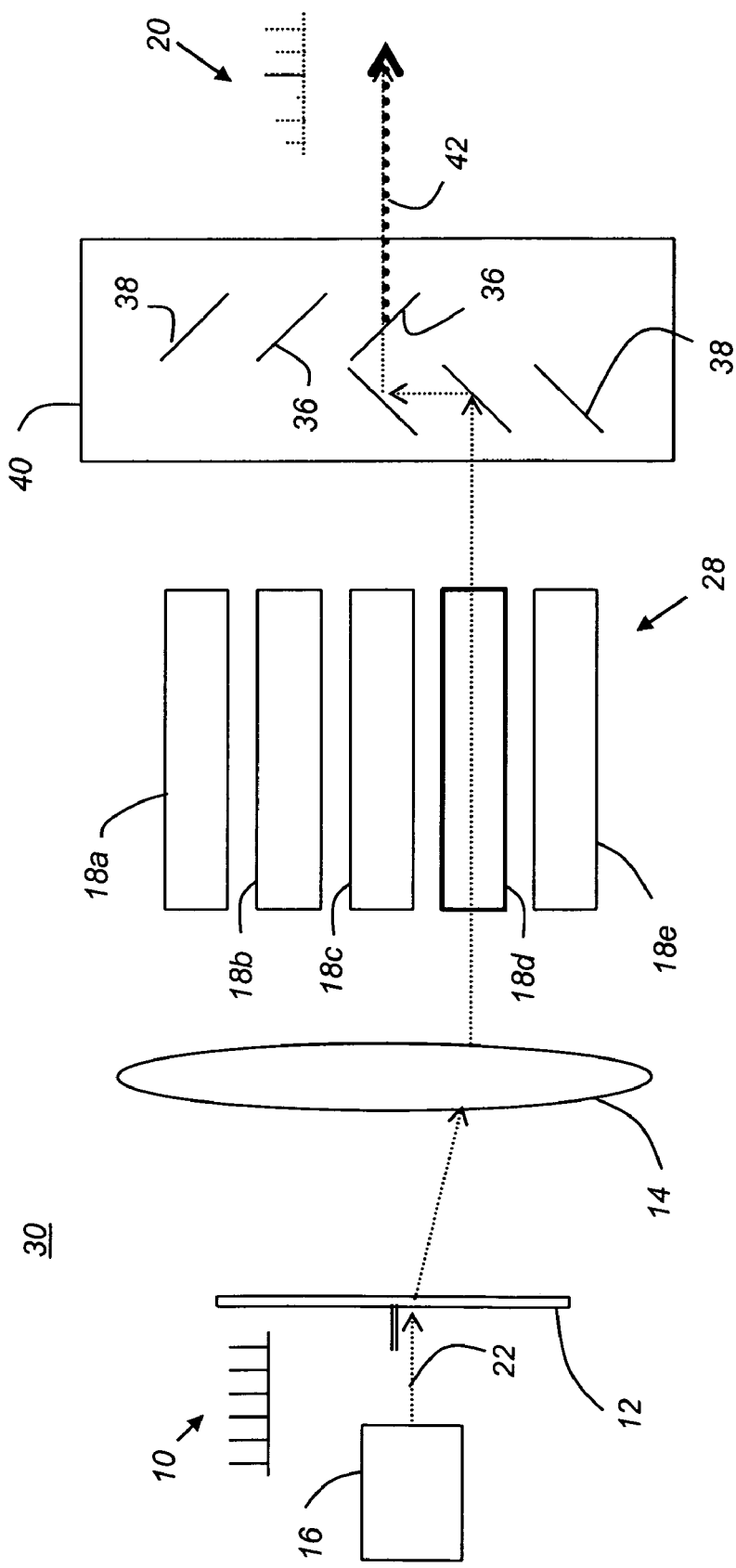
Figure 3E:
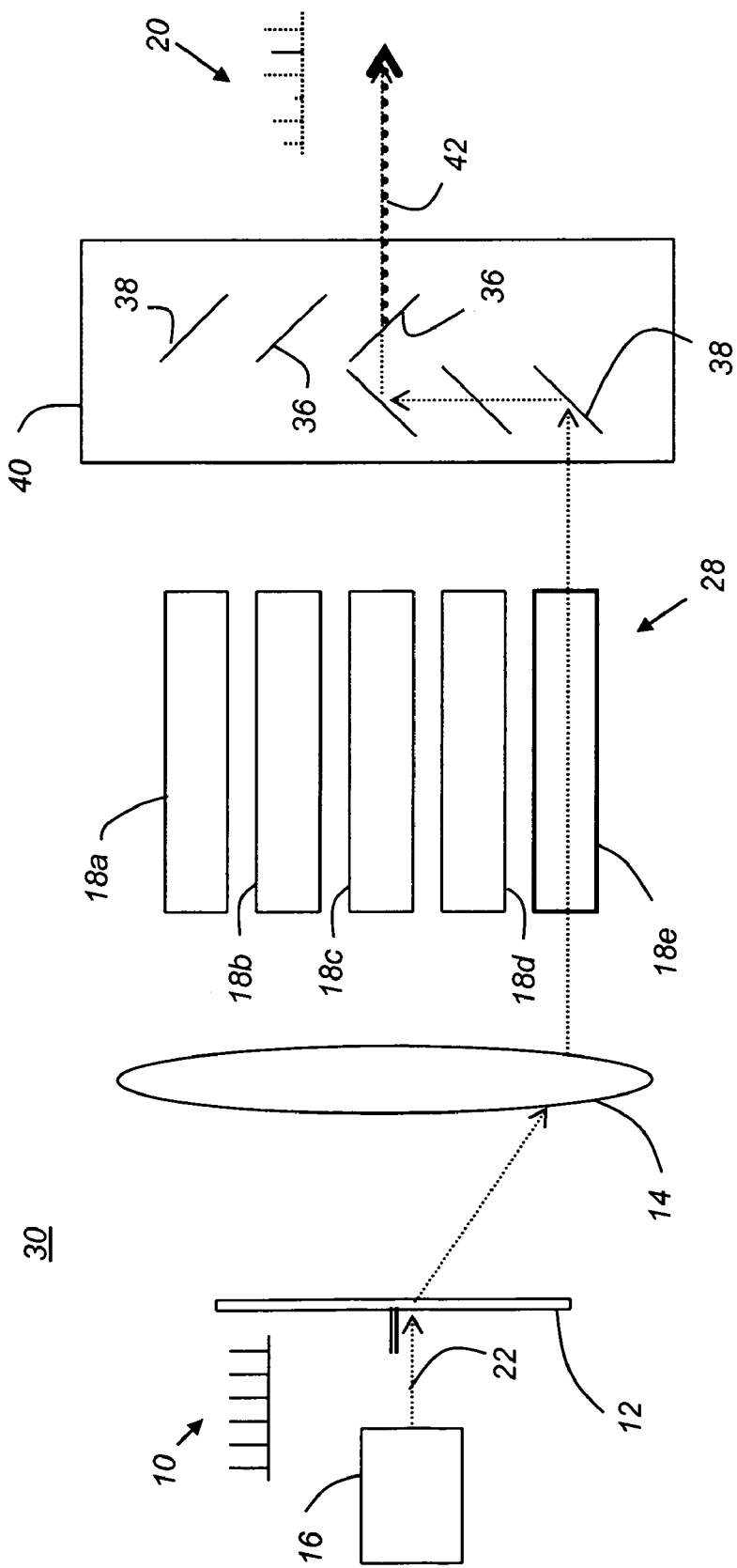

The schematic of FIG. 2 shows one embodiment of a beam generation apparatus 30 that illustrates key principles of operation of the present invention. As the radiation source, a high-frequency pulsed laser (not shown in FIG. 2) provides a polarized pulsed radiation beam 22 to a polarization beam splitter 24. The radiation beam 22 is transmitted and directed through a quarter waveplate 26, conditioning radiation beam 22 as a circularly polarized, pulsed radiation beam, to a high-frequency scanner 12 that operates as a variable beam deflector for redirecting radiation beam 22. In the embodiment shown in FIG. 2, high frequency scanner 12 is a reflective rotating polygon, such as those conventionally used in laser scanning and laser printer apparatus, for example. Here, the actuated high frequency scanner 12 runs synchronously to the frequency of the pulsed beam 22 and directs each pulse of pulsed beam 22 through a lens 14 or other suitable optics to one of modulators 18a, 18b, 18c, 18d, or 18e in an array of modulators 28. In this embodiment, each successive pulse of the pulsed radiation beam is redirected cyclically to a different modulation channel in turn, each modulation channel containing a separate beam intensity modulator 18a-18e. With this arrangement, each modulator 18a, 18b, 18c, 18d, or 18e, in turn, modulates a separate pulse at a variable modulation level, as indicated schematically to the right of each modulator 18a, 18b, 18c, 18d, or 18e. The modulation for each individual pulse can range from 0% to 100% attenuation, at the resolution of the modulator components. A mirror 32 or other reflective surface then redirects the modulated light either back through the modulator 18a, 18b, 18c, 18d, or 18e or along some other path to scanner 12. The modulated light is then transmitted along an output path that leads back through quarter waveplate 26. Recalling that this light has traversed quarter waveplate 26 twice, it can be noted that this light now has orthogonal polarization to the original pulsed radiation beam 22 that was transmitted through polarization beam splitter 24. This modulated light is therefore reflected from polarization beam splitter 24. Thus, the combination of polarization beam splitter 24, quarter waveplate 26, each light modulator 18a-18e, mirror 32 or other reflective component, and scanner 12 cooperate to provide the function of a pulse beam recombiner, forming modulated pulsed radiation beam 20, as shown in FIG. 2. Modulated pulsed radiation beam 20 can be provided as output or directed to another optical system. This sequential operation repeats cyclically, with each modulator 18a-18e receiving its single pulse or two or more successive pulses in turn. With reference to the embodiment of FIG. 2 having five modulators 18a-18e, this cyclical repetition means that the sixth input pulse of pulsed radiation beam 10 is then directed to the first modulator 18a, the seventh input pulse would be directed to second modulator 18b, and so on.

It is instructive to note that high frequency scanner 12 used in this multiplexing scheme may direct a single pulse or two or more successive pulses to one of modulators 18a, 18b, 18c, 18d, or 18e at a time. For precise control of output power, it is preferable to direct an integer number (that is, a whole or counting number: 0, 1, 2, 3, etc.) of sequential pulses to any single modulator channel with precision timing. The embodiment shown in FIG. 2 has each modulator 18a, 18b, 18c, 18d, or 18e modulate a single pulse at a time, that is, at a given attenuation level. However, two or more sequential pulses could be sent to each modulator, in turn, for attenuation at the same level, for example.

The schematic drawings of FIGS. 3A through 3E show, in sequence, the operation of another embodiment of the present invention. Here, high frequency scanner 12 that serves as the beam deflector is a holographic scanner that is actuable to deflect the input pulsed radiation beam 22 to one of the set of modulators 18a, 18b, 18c, 18d, or 18e at a time. Pulsed radiation beam 22 from a laser 16 or other type of radiation source need not be polarized. Here, the function of a beam recombiner is performed in a different manner. Instead of using reflection of modulated light back along the same path used for unmodulated light, as in apparatus 30 of FIG. 2, the embodiment of FIGS. 3A through 3E uses a beam combiner 40 to recombine the separate pulses of modulated light along an output axis 42. Beam combiner 40 includes one or more turning mirrors 38, and a series of dichroic surfaces 36 in one embodiment.

Figure 4:
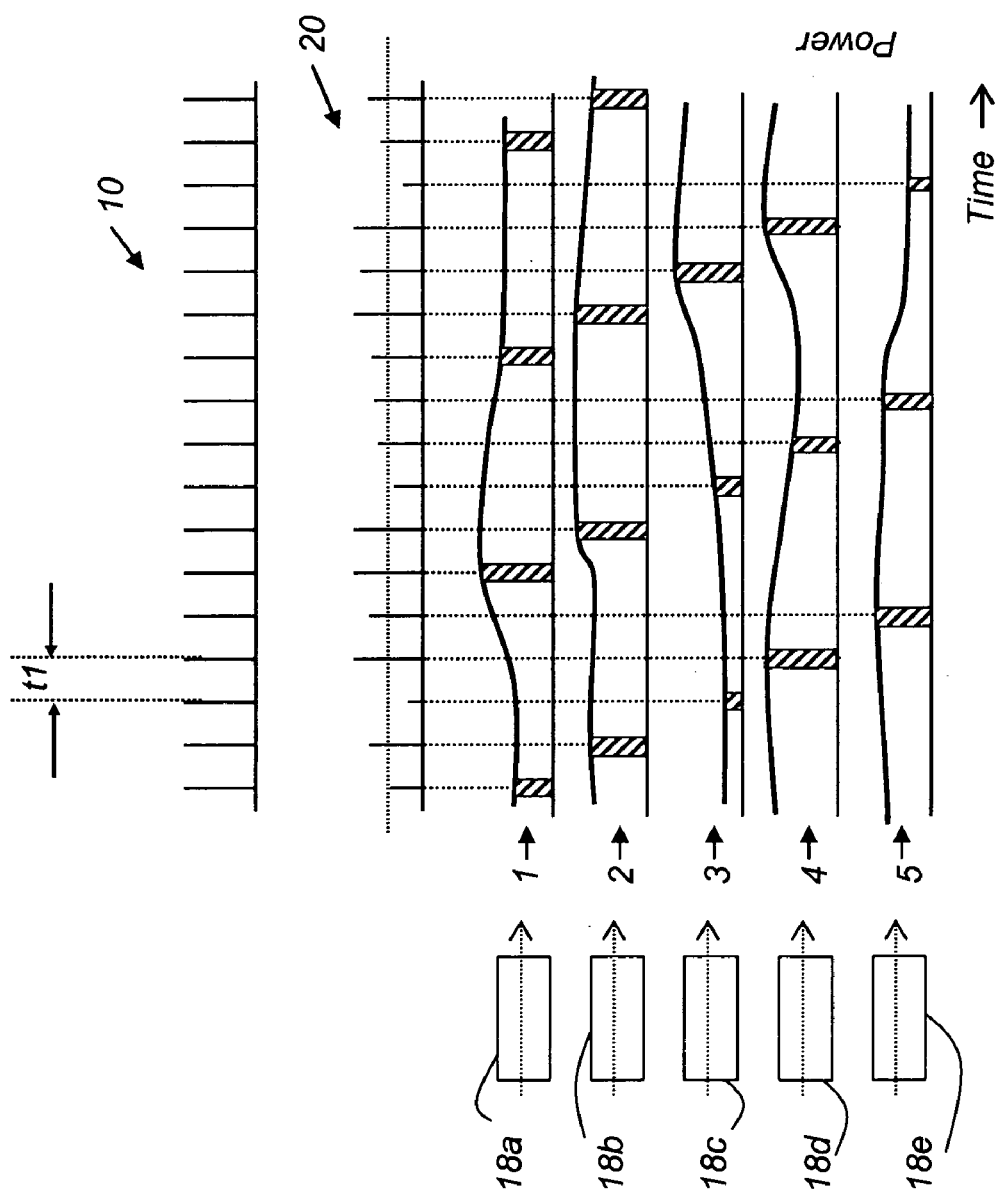
FIG. 4 is a timing diagram showing the synchronization of pulse generation and modulation components in one embodiment.

The timing diagrams of FIG. 4 show the overall synchronization used for an embodiment such as that shown in FIGS. 2 and 3A through 3E. In one embodiment, pulsed radiation beam 10 is provided at a frequency of 5 KHz, so that period t1 is 0.2 msec. Example modulation level graphs for modulators 1 through 5 (corresponding to modulators 18a through 18e in FIGS. 2 and 3A-3E) are also shown. Thus, for example, modulator 1 sets the level of the first pulse of modulated pulsed radiation beam 20, modulator 2 sets the level of the second pulse, modulator 3 sets the level of the third pulse, and so on. Note, for example, that it takes some time for modulator 1 to transition between the attenuation level needed for providing the first pulse and the level needed to provide the sixth pulse. Relative to the period t1 of the pulsed laser output, modulators 18a through 18e respond slowly, with a typical response time in the 1 KHz frequency range, that is, with a period of 1.0 msec. Thus, for example, a single modulator 18a clearly operates too slowly to be able to controllably modulate each individual pulse in a 5 KHz sequence of pulses. However, as the example embodiments of FIGS. 2 and 3A-3E show, two or more of these slower modulators can be used with the multiplexed arrangement of the present invention to provide pulse-by-pulse modulation of a pulsed laser beam that has a period shorter than modulator response time.

Figure 5A:
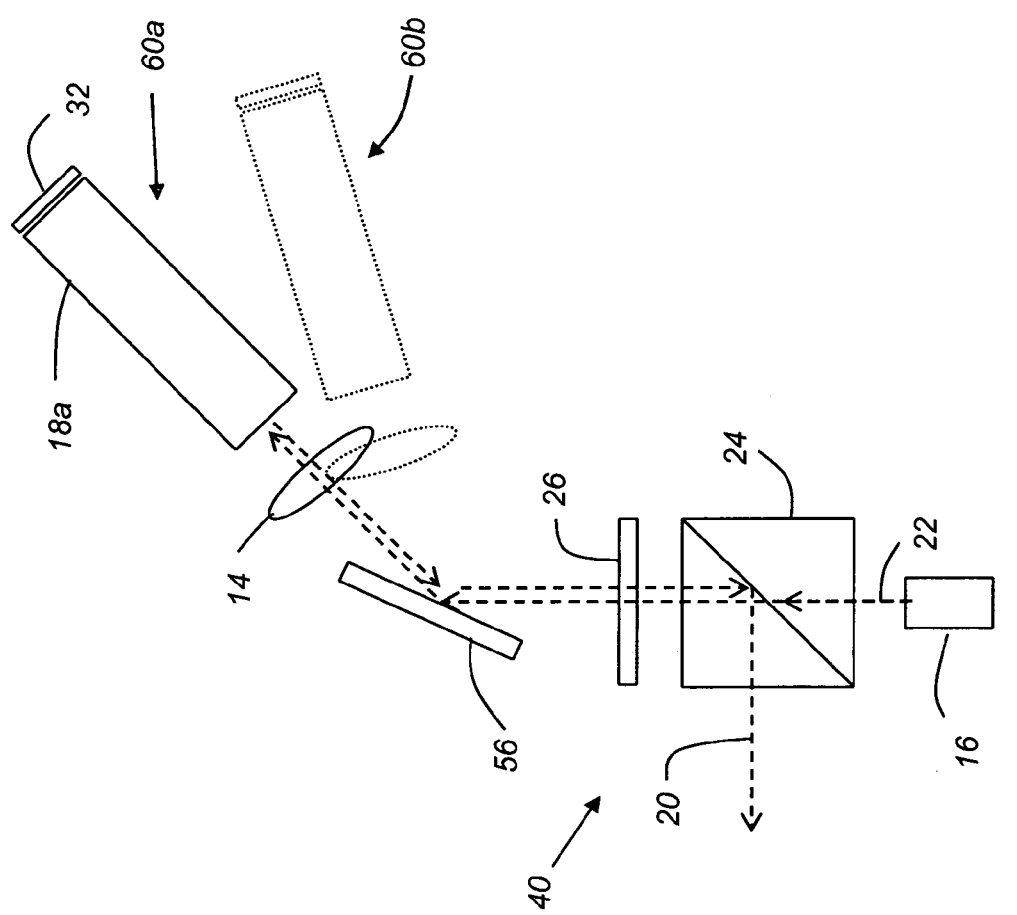
Figure 6A:
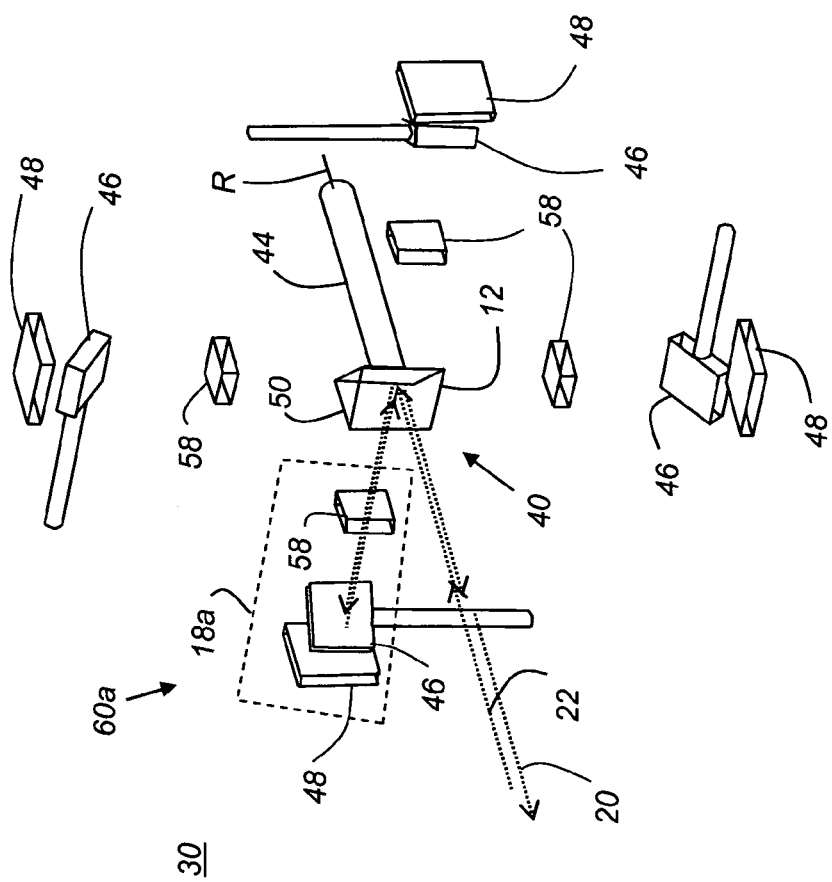
FIGS. 6A through 6D are perspective views showing an embodiment using four modulation channels.
Figure 6B:
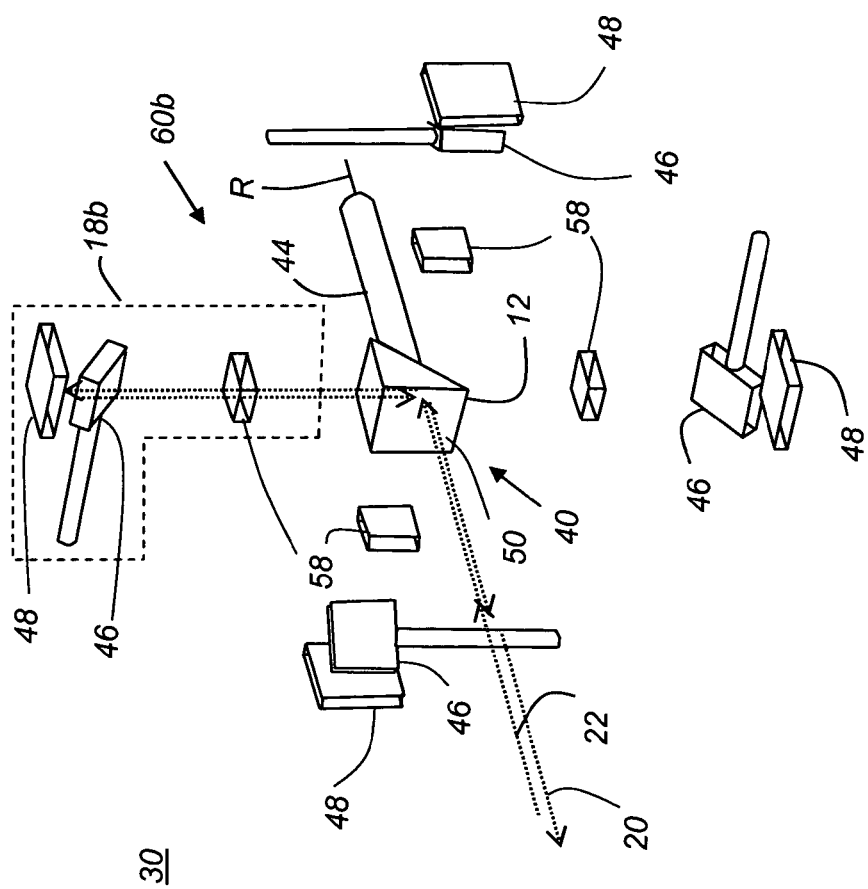
Figure 6C:
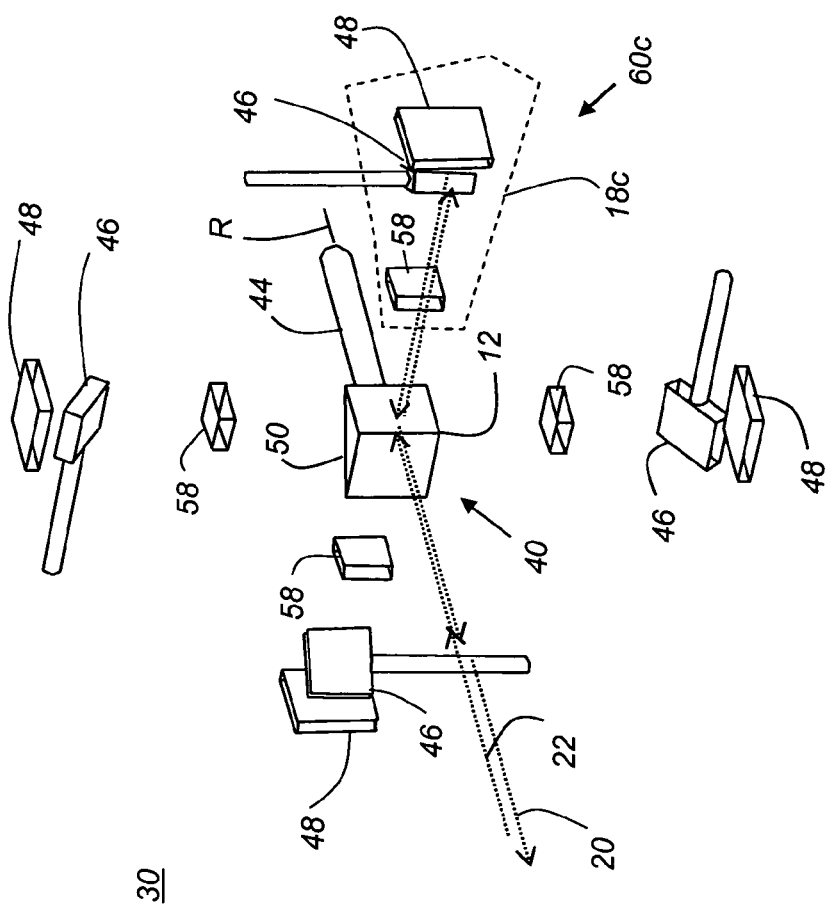
Figure 6D:
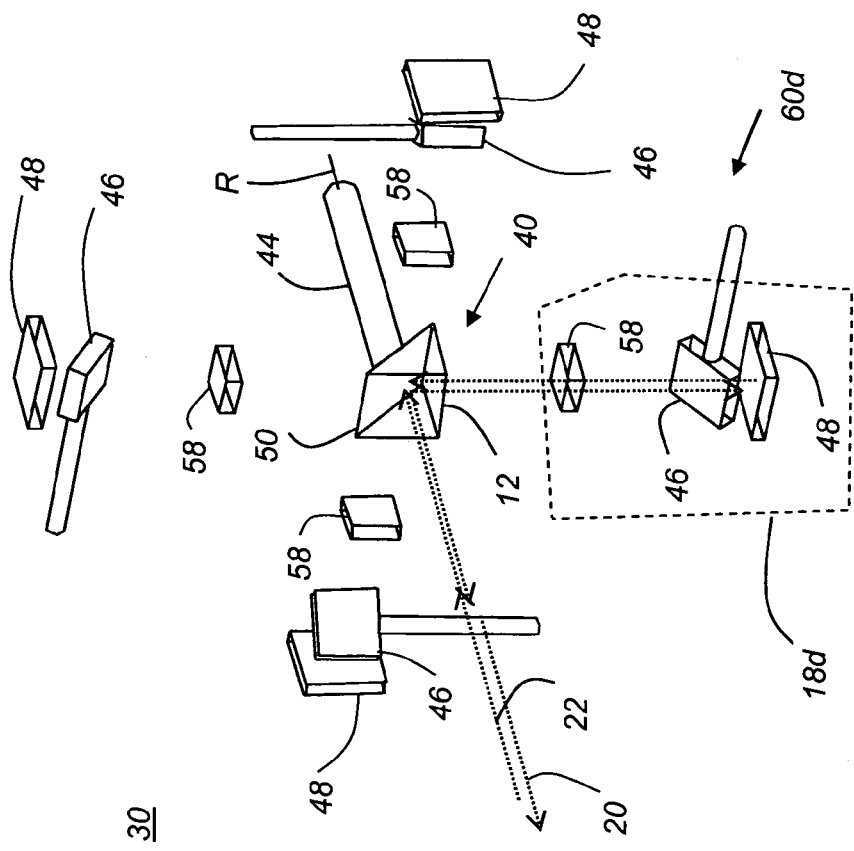

The functions of beam deflection, pulse modulation, and beam recombination can be performed using a number of possible combinations of components. The embodiment shown in the schematic drawings of FIGS. 5A and 5B employs a galvanometric scanner 56, also known as a galvanometer mirror, as its beam deflector. In this embodiment, high-frequency pulsed laser 16 provides polarized pulsed radiation beam 22 to polarization beam splitter 24. The radiation beam 22 is transmitted and directed through quarter waveplate 26 to galvanometric scanner 56. In a first position, as shown in FIG. 5A, galvanometric scanner 56 directs one or more pulses of the pulsed radiation beam to a first modulation channel 60a that includes modulator 18a and mirror 32. A second modulation channel 60b, shown in dotted outline in FIG. 5A, is configured for handling a subsequent pulse or group of pulses. Modulated light from first modulation channel 60a is then redirected back through quarter waveplate 26 and to polarization beam splitter 24, which reflects the modulated pulses to the output as part of modulated pulsed radiation beam 20. Galvanometric scanner 56 is then actuated to its second position, as is shown in FIG. 5B. Here, galvanometric scanner 56 directs the pulsed radiation beam to second modulation channel 60b, with modulation, reflection, and recombination of modulated light taking place in similar fashion. The embodiment of FIGS. 5A and 5B may be advantaged for its mechanical simplicity and ruggedness; however, more than two modulation channels may be needed to provide pulse-by-pulse modulation at high pulse repetition frequencies.

The perspective views of FIGS. 6A, 6B, 6C, and 6D show an embodiment of beam generation apparatus 30 having four modulation channels 60a, 60b, 60c, and 60d, wherein the scanner 12 that functions as both beam deflector and recombining beam combiner 40 is a rotating monogon 50 or single facet scanner. In the embodiment shown, this prism component rotates on a shaft 44. The pulsed light is thereby cyclically directed into each modulation channel 60a, 60b, 60c, and 60d, in turn, for variable modulation. With respect to the axis of rotation R of shaft 44, modulation channels 60a, 60b, 60c, and 60d are preferably disposed about this axis at equal angular increments.

Operation is similar in each modulation channel 60a, 60b, 60c, and 60d. Considering the first modulation channel 60a shown in FIG. 6A, the redirected pulse or pulses of pulsed radiation beam 22 go to modulator 18a, formed using a number of components, as indicated in dashed outline. Modulator 18a through 18d, each highlighted in dashed outline in one of corresponding FIGS. 6A through 6D, each have a galvanometer arrangement. Referring particularly to modulator 18a in FIG. 6A, a converging lens 58 directs the reflected light from rotating monogon 50 or other type of scanner 12 toward a refractive plate 46. Refractive plate 46 is galvanometrically actuated to reciprocate between positions, providing a variable amount of light into a slit surface 48. This combination of components then reflects a portion of the beam back to scanner 12 and to the output as part of modulated pulsed radiation beam 20. Modulators 18b, 18c, and 18d in FIGS. 6B, 6C, and 6D operate similarly. It is instructive to note that while the embodiment of FIGS. 6A through 6D shows a reciprocating device used to modulate light as an exemplary embodiment of modulators 18a-18d, other types of modulator can be used. Additionally, while four modulators 18a-18d are shown, other arrangements using a different number of modulators are possible.

As monogon 50 rotates, the incident pulsed light is successively supplied to modulators 18b, 18c, and 18d in sequence, again providing the continuous pulse train of modulated pulsed radiation beam 20 cyclically by modulating and recombining light from each of the modulation channels. Not specifically shown in FIGS. 6A through 6D are components for providing and conditioning input pulsed radiation beam 22, or for providing the modulated pulsed radiation beam 20 for use within an optical system. These components would be familiar to those skilled in optical design arts. Polarization or other methods could be used for separating the modulated and un-modulated light paths, as described previously.

Figure 7:
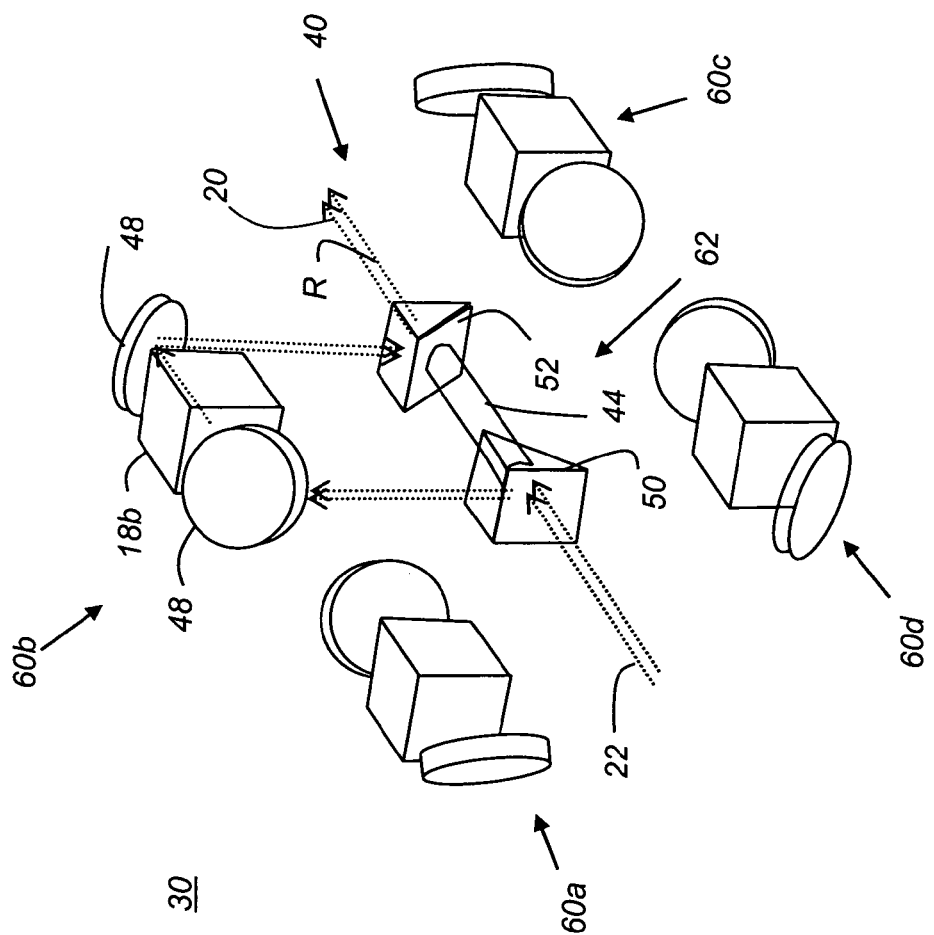
FIG. 7 is a perspective view showing a beam recombiner for the embodiments of FIGS. 6A through 6D.

The perspective view of FIG. 7 shows another embodiment using a rotating double monogon 62. Rotating double monogon 62, shown also in the side view of FIG. 8A, consists of two monogons 50, 52 on opposite ends of rotatable shaft 44. In operation, rotating double monogon 62 performs two essential functions: (i) beam deflector functions, analogously performed by scanner 12 in the embodiment of FIGS. 2 and 3A-3E and by galvanometric scanner 56 in FIGS. 5A and 5B; and (ii) beam combiner 40 functions, similarly to that shown for the FIG. 3A-3E embodiment. In FIG. 7, operation of one modulation channel 60b is shown. First monogon 50 rotates into position for a modulation channel and directs one or more pulses, to modulator 18b in this example, through turning mirror 48. The modulated output from modulation channel 60b is then directed, through a second turning mirror 48, to second rotating monogon 52 that, acting here as beam combiner 40, directs the modulated light to the output as part of modulated pulsed radiation beam 20. As shaft 44 rotates, the coupled pair of monogons 50 and 52 simultaneously move into position for each subsequent modulation channel, following a pattern similar to that shown for FIGS. 6A-6D.

Figure 8A:
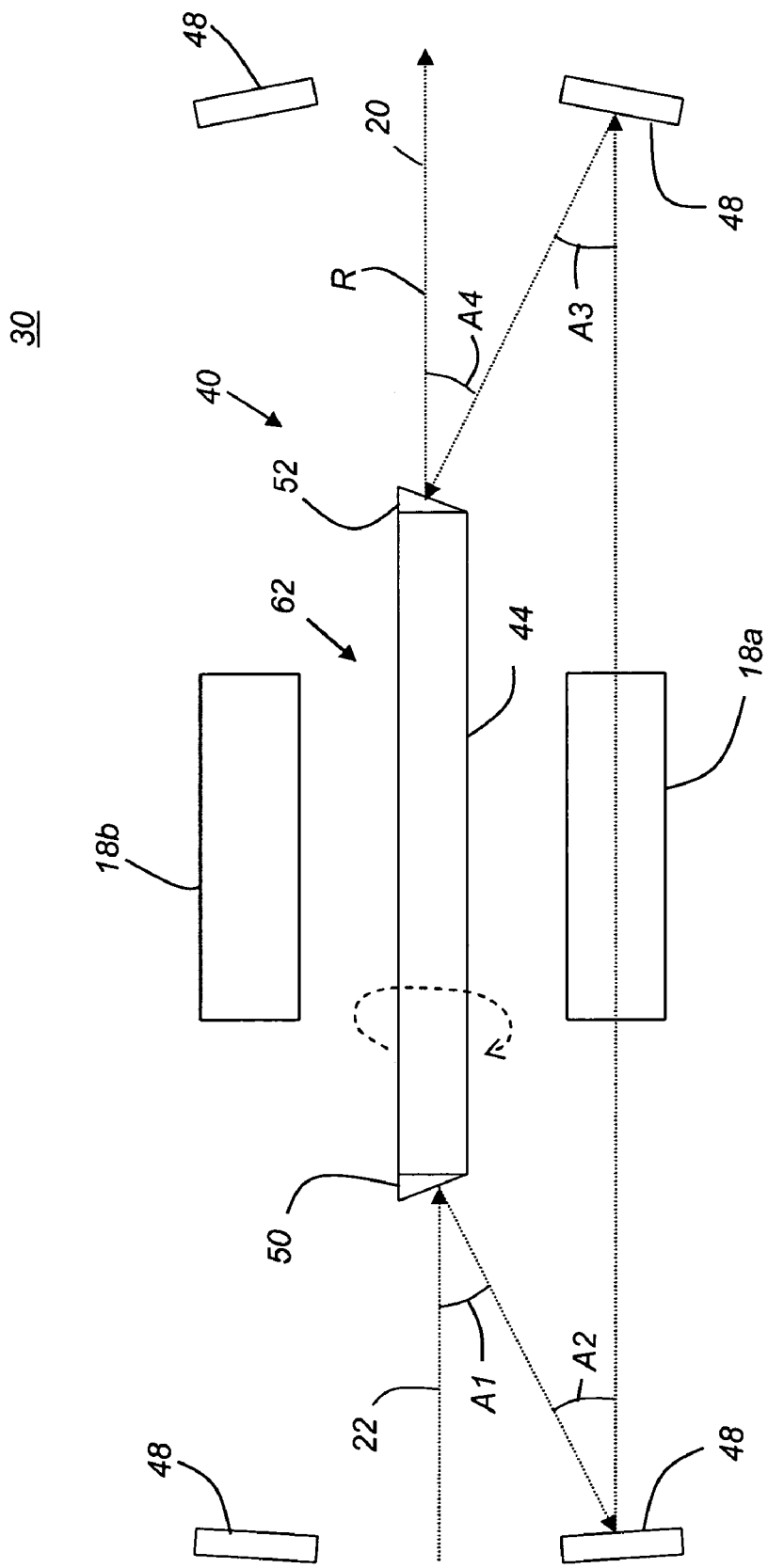
FIG. 8A is a side view showing a rotating double monogon used for scanning and recombination in one embodiment.

The side view of FIG. 8A illustrates an embodiment with the arrangement of FIG. 7 using double monogon 62 in beam generation apparatus 30 for modulating polarized light. With this arrangement, double monogon 62 again serves both beam deflector and beam recombiner functions, with monogon 50 serving as beam deflector and monogon 52 as beam recombiner. Two modulators 18a and 18b are shown; additional modulators could be distributed at suitable angular positions about axis of rotation R. Because reflection at higher incidence angles can adversely affect polarization, it is advantageous to reflect polarized light at acute angles, preferably at acute angles of less than 45 degrees. With the angular arrangement of double monogon 62 and mirrors 48 in FIG. 8A, incidence and reflection angles A1, A2, A3, and A4 are reduced, minimizing the effects of reflection upon polarization state.

Figure 8B:
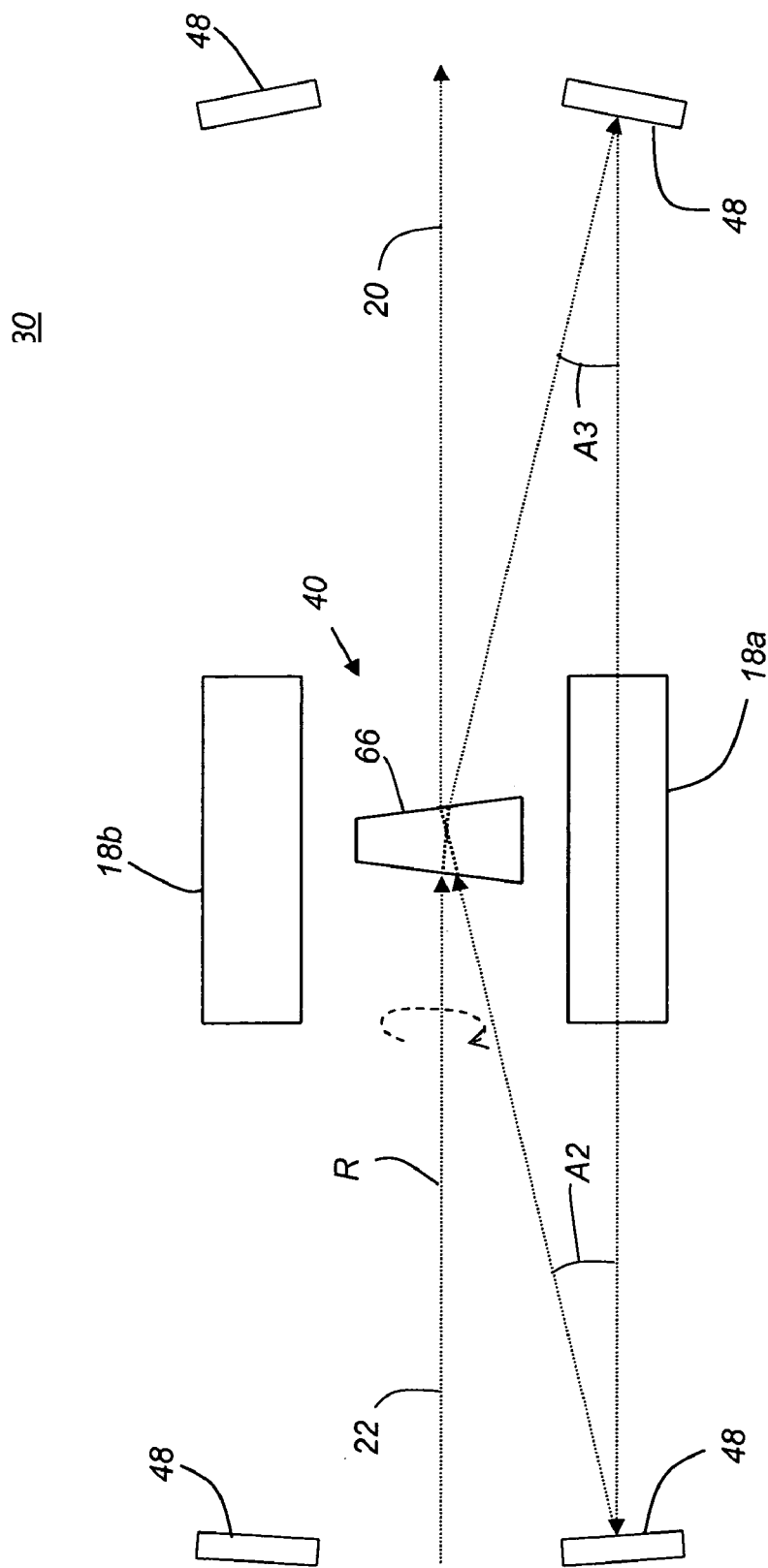
FIG. 8B shows an embodiment of beam generation apparatus that uses a refractive rotating prism as a beam deflector and recombiner.

FIG. 8B shows yet another arrangement wherein a single component provides both beam deflection and beam recombination. The side view of FIG. 8B shows an embodiment of beam generation apparatus 30 that uses a refractive rotating prism 66 as its rotating beam deflector and beam recombiner. Refractive rotating prism 66 rotates about axis R (which is in the plane of the page). At the rotational position that is shown in FIG. 8B, refractive rotating prism 66 redirects one or more pulses of incident pulsed radiation beam 22 to mirror 48 at an acute incidence and reflection angle A3. Mirror 48 reflects the light toward modulator 18a. The modulated light pulse that is output from modulator 18a is then reflected back toward refractive rotating prism 66 from second mirror 48. Incidence and reflection angles A2 and A3 are reduced with this embodiment. As with FIG. 8A, only two modulators 18a and 18b are shown; additional modulators could be distributed at suitable angular positions about axis of rotation R.

Figure 9:
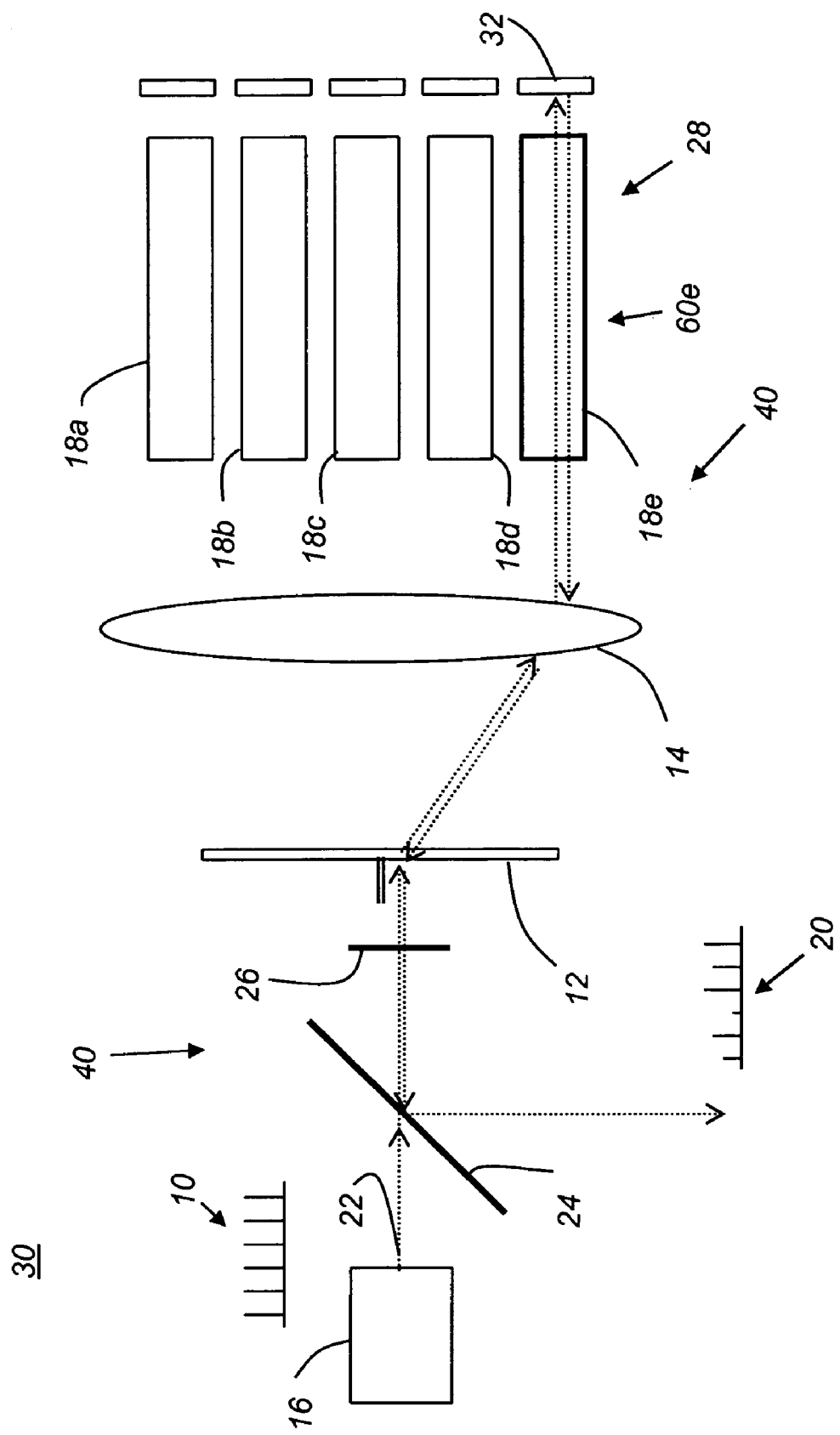
FIG. 9 is a schematic block diagram of an embodiment employing a holographic scanner and polarized light source.

FIG. 9 is a schematic block diagram of an embodiment employing a holographic scanner, in which laser 16 is a polarized light source. Pulsed radiation beam 22 goes to polarization beam splitter 24 and through quarter waveplate 26, then to the holographic scanner 12 which provides beam deflection. Redirection of one pulse or set of pulses is shown in FIG. 9, to modulation channel 60e with modulator 18e. Modulated light is then reflected from mirror 32, back through or around modulator 18e, and through quarter waveplate 26 again, in the opposite direction. Polarizing beam splitter 24 now acts as a part of beam recombiner 40 and reflects this output light and directs it to the output of beam generation apparatus 30. Modulation for each of the other modulation channels follows the cyclic pattern described in detail in earlier examples.

As the embodiments presented in FIGS. 2, 3A-3E, 5A, 5B, 6A-6D, 7, 8A, 8B, and 9 show, there are numerous possible arrangements for providing the beam recombining function needed for the present invention. In embodiments such as those shown in FIGS. 2, 5A, 5B, 6A-6D, and 8B beam combiner 40 is formed using one or more components that are also in the path of incoming, unmodulated light and that cooperate to provide modulated pulsed radiation beam 20. Alternately, in embodiments such as those shown in FIGS. 3A-3E, 7, and 8A, beam combiner 40 is a separate component or set of components that are not in the path of incoming, unmodulated light.

The invention can be used with various laser power levels, given suitably designed beam-shaping optics, beam deflection devices, and modulation devices. In one embodiment, for example, the source pulses are delivered from an excimer laser at about 10 mJ (milli-Joules) per pulse. Pulse widths for pulsed laser sources are typically very small relative to the time period (t1 in FIG. 1) with typical pulse widths in the 50 ns to 100 ns range. As can be seen from the example embodiments shown herein, the apparatus and method of the present invention allow the use of multiple, relatively slow beam intensity modulators, arranged in an array 28, for performing pulse-by-pulse modulation of a pulsed radiation beam. This enables the relative intensity of each individual pulse to be controlled, which has decided advantages for applications such as UV lithography.

In addition to pulse-to-pulse modulation, another advantage afforded by the apparatus and method of the present invention relates to improved power dissipation. By directing a small number of laser pulses to each of a number of modulation channels in a cyclic manner, the present invention can be used to help extend the lifetime of modulation components and their support optics.

Any of a number of types of beam intensity modulators could be employed in an apparatus of the present invention, including AOM, EOM, or LC devices, piezoelectric- or servo-actuated apertures, shutter(s) including rotating shutters or shutters actuated otherwise, or slits actuated by piezoelectric actuators or servo devices or voice coils, galvanometer-actuated devices, or other devices. For example, electro-optic modulators can include Pockels cell devices, variable spaced Fabry-Perot etalons, partially transmitting meshes and perforated plates, partially transmitting or partially reflecting optical coatings or surfaces, bulk absorbing optical materials, and mechanical mechanisms such as moving blades or shutters. Optical coatings, such as dielectric films, can be used to obtain variable transmission by tilting attenuator elements as well as by interchanging fixed elements or translating elements which have a transmission gradient across the pulsed light path. Either step-wise attenuation control or continuous variable control could be used. Discrete intervals of attenuation can be linear, logarithmic, or have other input-to-output characterization. It is instructive to note that in some of the embodiments described herein, light can be passed through the modulator in both directions and thus modulated twice. This happens, for example, using the basic arrangement described with reference to FIG. 2. In contrast, the component arrangement of FIGS. 3A-3E shows light transmitted through each respective modulator 18a through 18e only once.

Figure 10:
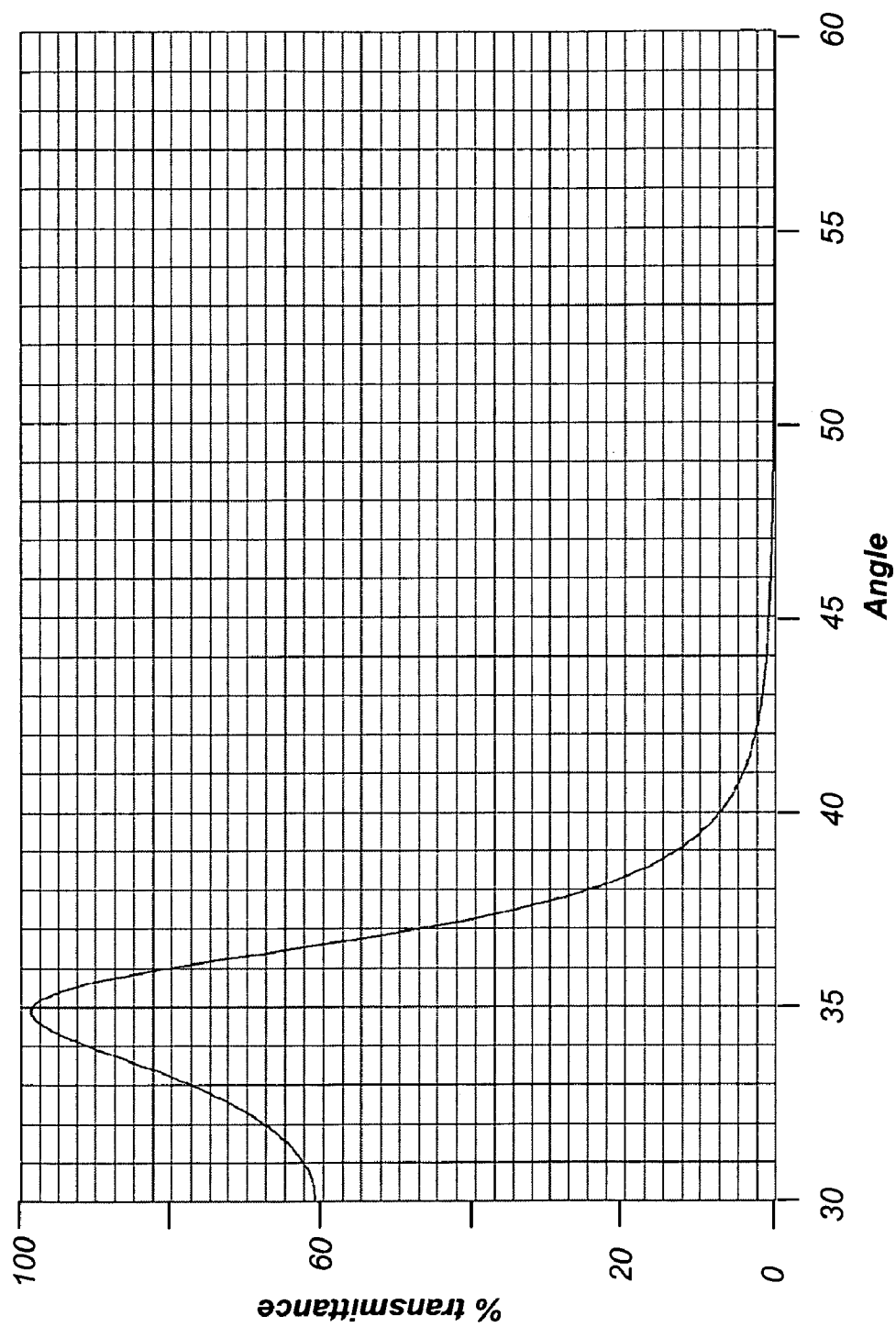
FIG. 10 is a graph showing edge filter response used for a modulator in one embodiment.

One type of beam intensity modulator that shows particular promise uses dichroic edge filters that can be selectively actuated at suitable angles for variable transmittance. The graph of FIG. 10 shows a transmittance curve of an edge filter in one embodiment. As this curve shows, an angular change to incident light over about 10 degrees, that is, from about 35 degrees to about 45 degrees, changes transmittance of this filter dramatically from near 100% to near 0%. Continuously variable optics employing this and other coatings characteristics for beam attenuation are provided by companies such as Laseroptik, Garbsen, Germany, for example.

Figure 11:
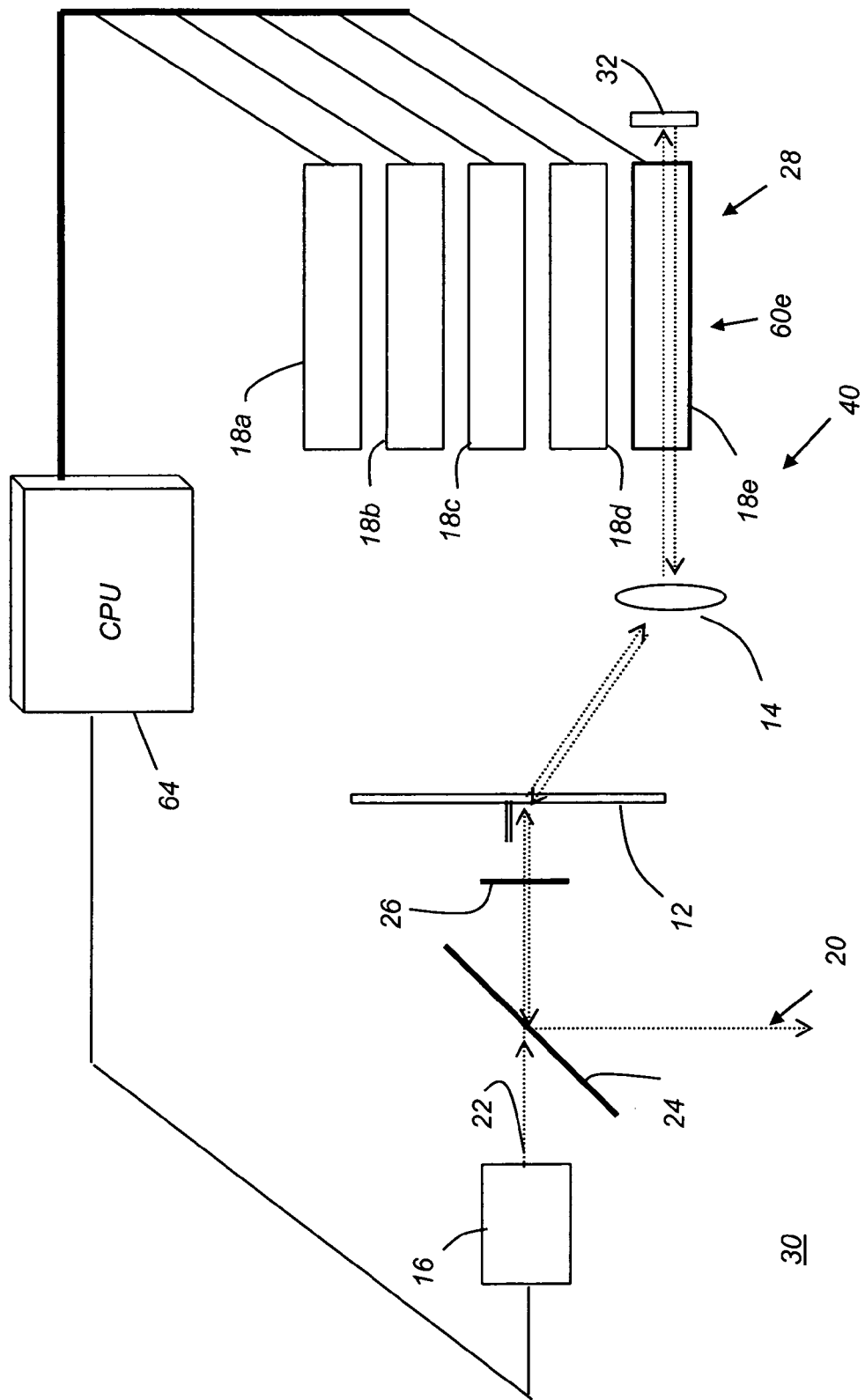
FIG. 11 is a schematic block diagram showing system control components used for a beam generation apparatus.

FIG. 11 shows a system embodiment of beam generation apparatus 30, using one of the exemplary arrangements of optical components described previously. As is shown in FIG. 11, some type of control logic processor 64 is needed in order to synchronize the modulation level of each modulator 18a, 18b, 18c, etc. with the timing of pulses received from the beam deflector of scanner 12. Control signals to each modulator would provide the needed modulation levels with this needed synchronization, as was described with reference to the example waveforms of FIG. 4. Control logic for this function can be integral to beam generation apparatus 30, such as using a dedicated microprocessor or other programmed control component. Optionally, software executing on an external computer workstation or other external processor could provide the needed signal levels and synchronization. As can be appreciated by one skilled in the optical apparatus arts, various types of feedback mechanisms can also be utilized for providing status information to control logic processor 64, such as for synchronization of control signals with positional data.

The invention has been described in detail with particular reference to certain preferred embodiments thereof, but it will be understood that variations and modifications can be effected within the scope of the invention as described above, and as noted in the appended claims, by a person of ordinary skill in the art without departing from the scope of the invention. For example, the laser source itself could be an excimer laser or some other type of high frequency source. For example, laser 16 could be a pulsed solid state laser, such as a frequency quadrupled YAG (Yttrium aluminum garnet) laser that is Q-switched or mode locked. There are a number of options for providing scanner 12 or, more generally, a beam deflector, for cyclic redirection of the pulsed radiation beam as used in the apparatus of the present invention. These include, for example, a reflective rotating polygon, a rotating monogon, or other type of rotatable reflective element, a holographic scanner, a galvanometer scanner, and resonant modulator components, as well as various components used in combination. A variety of polarization beam splitters 24 could be used, such as a MacNeille prism, disclosed in U.S. Pat. No. 2,403,731, for example, or wire-grid beam splitter components, such as the type of wire grid device described in U.S. Pat. No. 6,234,634 to Hansen et al.

Thus, what is provided is an apparatus and method for obtaining a pulsed light output with variable power, pulse-to-pulse.

PARTS LIST

10. Pulsed radiation beam
12. Scanner
14. Lens
16. Laser
18a, 18b, 18c, 18d, 18e. Modulator
20. Modulated pulsed radiation beam
22. Pulsed radiation beam
24. Polarization beam splitter
26. Quarter waveplate
28. Array of modulators
30. Beam generation apparatus
32. Mirror
36. Dichroic surface
38. Turning mirror
40. Beam combiner
42. Output axis
44. Shaft
46. Plate
48. Mirror
50, 52. Monogon
56. Galvanometric scanner
58. Lens
60a, 60b, 60c, 60d. Modulation channel
62. Double monogon
64. Control logic processor
66. Prism
A1, A2, A3, A4. Angle
R. Axis of rotation

The invention claimed is:

1. An apparatus for providing a modulated pulsed radiation beam, comprising:
   a) a pulsed radiation source that generates a pulsed radiation beam with successive pulses that repeat at a constant pulse repetition frequency, wherein the pulsed radiation beam is an ultraviolet beam at a power level suitable for lithography;
   b) a rotating beam deflector that rotates in the path of the pulsed radiation beam and that is disposed to cyclically redirect one or more successive pulses of the pulsed radiation beam toward one of a plurality of beam intensity modulation channels at a time, at a constant rate; each beam intensity modulation channel comprising a beam intensity modulator for providing a variable attenuation of incident pulsed radiation; and
   c) a beam recombiner that combines modulated light from each of the plurality of beam intensity modulators to form the modulated pulsed radiation beam at the constant pulse repetition frequency.

2. The apparatus of claim 1 wherein the beam recombiner comprises a polarizing beam splitter.

3. The apparatus of claim 2 wherein the beam recombiner further comprises a quarter wave plate.

4. The apparatus of claim 1 wherein each beam intensity modulation channel further comprises a reflective surface for redirecting modulated light toward the beam recombiner.

5. The apparatus of claim 1 wherein the beam intensity modulators are disposed at equal angular increments about the axis of rotation of the rotatable beam deflector.

6. The apparatus of claim 1 wherein the rotating beam deflector deflects the incident pulsed radiation beam at an angle of less than 45 degrees.

7. The apparatus of claim 1 wherein the rotating beam deflector and beam recombiner are coupled by a rotatable shaft that rotates about the optical axis.

8. The apparatus of claim 1 further comprising a control logic processor for providing modulation control signals to each of the plurality of beam intensity modulation channels according to the rotational position of the rotating beam deflector.

9. The apparatus of claim 1 wherein the beam deflector and beam recombiner are the same component.

10. The apparatus of claim 1 wherein the beam intensity modulator in at least one of the beam intensity modulation channels is a Fabry-Perot etalon.

11. The apparatus of claim 1 wherein the beam intensity modulator in at least one of the beam intensity modulation channels is a piezoelectric actuated device.

12. The apparatus of claim 1 wherein the rotating beam deflector is a reflective element.

13. An apparatus for providing a pulsed radiation beam, comprising:
   a) a radiation source for providing a polarized, pulsed radiation beam at a constant pulse repetition frequency, wherein the pulsed radiation beam is an ultraviolet beam at a power level suitable for lithography;
   b) a polarization beam splitter transmissive to the polarized, pulsed radiation beam and reflective to light having the orthogonal polarization;
   c) a quarter wave plate in the path of the transmitted polarized, pulsed radiation beam directed through the polarization beam splitter, for providing a circularly polarized, pulsed radiation beam;
   d) a rotatable beam deflector actuable to redirect successive pulses of the circularly polarized, pulsed radiation beam cyclically toward each of a plurality of beam intensity modulators in turn; and
   e) one or more reflective surfaces disposed to redirect modulated light from each beam intensity modulator back toward the rotatable beam deflector and back through the quarter wave plate for reflection from the polarization beam splitter.

14. The apparatus of claim 13 wherein the beam intensity modulators are disposed at substantially equal angular increments about the axis of rotation of the rotatable beam deflector.

15. An apparatus for providing a modulated pulsed radiation beam, comprising:

a) a radiation source that generates a pulsed radiation beam with successive pulses that repeat at a constant pulse repetition frequency, wherein the pulsed radiation beam is an ultraviolet beam at a power level suitable for lithography;

b) a beam deflector that rotates about the optical axis on a rotatable shaft in the path of the pulsed radiation beam and that, at each of a plurality of angular positions, cyclically redirects an integer number of sequential pulses of the pulsed radiation beam toward one of a plurality of beam intensity modulation channels at a time;

each beam intensity modulation channel comprising a first turning mirror disposed to direct the pulsed radiation beam toward a beam intensity modulator for providing a variable attenuation of incident pulsed radiation and a second turning mirror disposed to direct modulated light from the beam intensity modulator toward a beam recombiner;

wherein the beam intensity modulation channels are disposed at equal angular increments about the axis of rotation of the rotatable shaft; and c) the beam recombiner comprising a reflective surface on the rotatable shaft for combining modulated light from each of the plurality of beam intensity modulators to form the modulated pulsed radiation beam at the constant pulse repetition frequency.

16. A method for providing a modulated pulsed radiation beam comprising a repeated sequence of:

rotating a beam deflector to a first angular position about an axis of rotation;

directing a first light pulse along the axis of rotation toward the beam deflector at the first angular position and redirecting the first light pulse toward a first modulator;

modulating the first pulse at the first modulator to generate a first modulated pulse;

directing the first modulated pulse onto an output axis;

rotating the beam deflector to a second angular position about the axis of rotation;

directing a second light pulse along the axis of rotation toward the beam deflector at the second angular position and redirecting the second light pulse toward a second modulator;

modulating the second pulse at the second modulator to generate a second modulated pulse; and directing the second modulated pulse onto the output axis, wherein the first and second pulses are ultraviolet pulses at a power level suitable for lithography.

17. The method of claim 16 wherein the step of rotating the beam deflector comprises rotating a holographic scanner.

* * * * *